(12) United States Patent
Le et al.

(10) Patent No.: US 10,936,327 B2
(45) Date of Patent: *Mar. 2, 2021

(54) METHOD OF IMPLEMENTING MAGNETIC RANDOM ACCESS MEMORY (MRAM) FOR MOBILE SYSTEM-ON-CHIP BOOT

(71) Applicant: Avalanche Technology, Inc., Fremont, CA (US)

(72) Inventors: Ngon Van Le, Fremont, CA (US); Ravishankar Tadepalli, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/808,099

(22) Filed: Mar. 3, 2020

(65) Prior Publication Data

US 2020/0201653 A1   Jun. 25, 2020

Related U.S. Application Data

(63) Continuation of application No. 15/592,575, filed on May 11, 2017, now Pat. No. 10,628,169, which is a continuation of application No. 14/091,318, filed on Nov. 26, 2013, now Pat. No. 9,658,859.

(60) Provisional application No. 61/800,843, filed on Mar. 15, 2013.

(51) Int. Cl.
*G06F 9/4401* (2018.01)
*G06F 15/78* (2006.01)
*G11C 14/00* (2006.01)
*G11C 11/16* (2006.01)

(52) U.S. Cl.
CPC .......... *G06F 9/4406* (2013.01); *G06F 9/4401* (2013.01); *G06F 15/7821* (2013.01); *G11C 14/0036* (2013.01); *G11C 11/16* (2013.01)

(58) Field of Classification Search
CPC ........................... G06F 9/4406; G06F 15/7821
USPC ............................................................ 713/2
See application file for complete search history.

(56) References Cited

U.S. PATENT DOCUMENTS

| | | | |
|---|---|---|---|
| 2005/0093572 A1 | 5/2005 | Sun et al. | |
| 2011/0060897 A1* | 3/2011 | Toelkes | G06F 9/4418 713/2 |
| 2012/0331281 A1 | 12/2012 | Borras et al. | |
| 2013/0145080 A1* | 6/2013 | Grandin | G06F 12/0246 711/103 |

* cited by examiner

*Primary Examiner* — Robert A Cassity
(74) *Attorney, Agent, or Firm* — Bing K. Yen

(57) ABSTRACT

The present invention is directed to a method for booting a system-on-chip (SoC) including the steps of directly executing a boot software from an on-chip magnetic random access memory (MRAM) residing on a same semiconductor as the SoC; directly executing an operating system software from an external MRAM by the SoC without loading the operating system into a volatile memory; and directly executing an application software from the external MRAM by the SoC, wherein the external MRAM is coupled to the SoC and is configured for storing the operating system software and the application software.

5 Claims, 2 Drawing Sheets

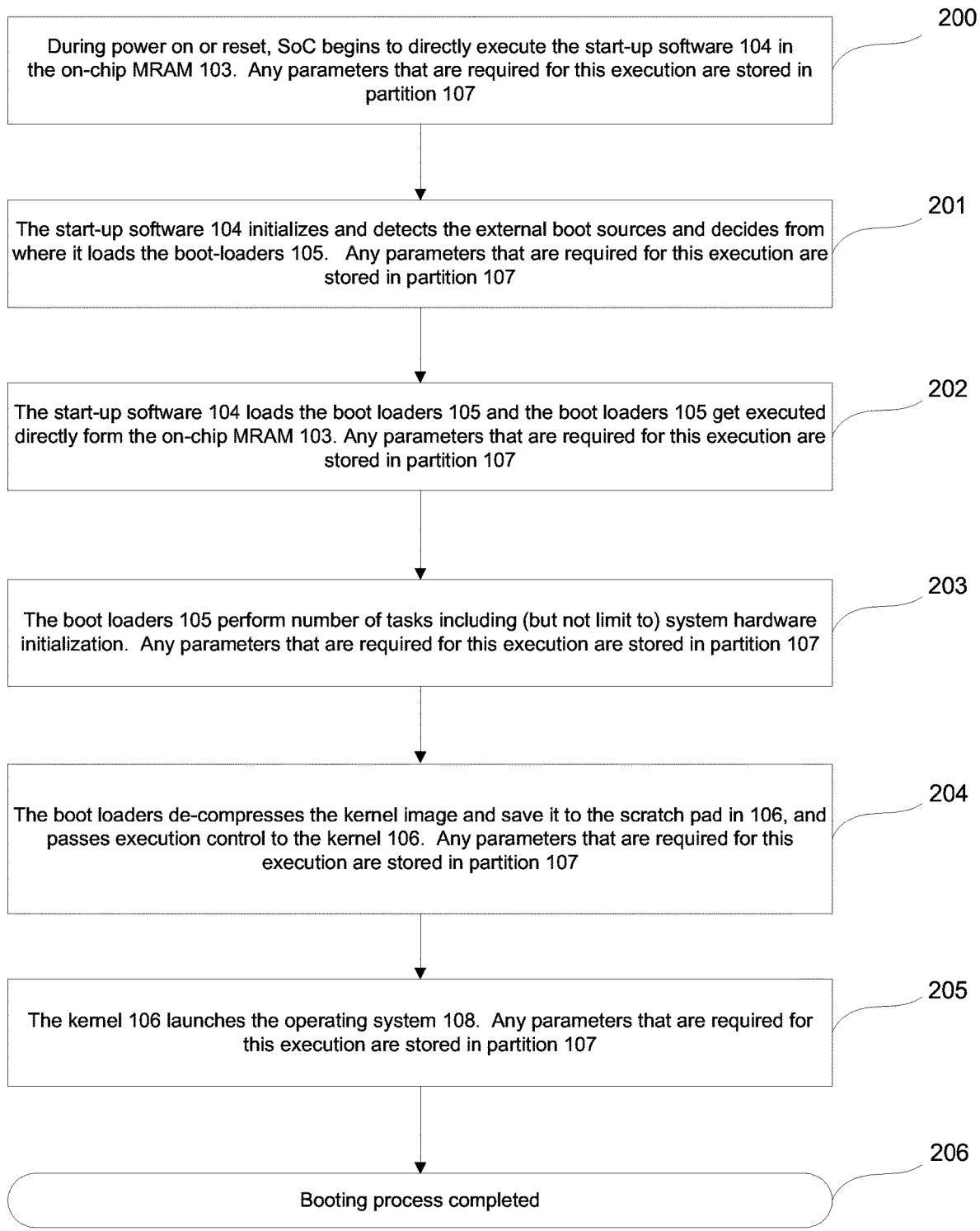

Figure 1:
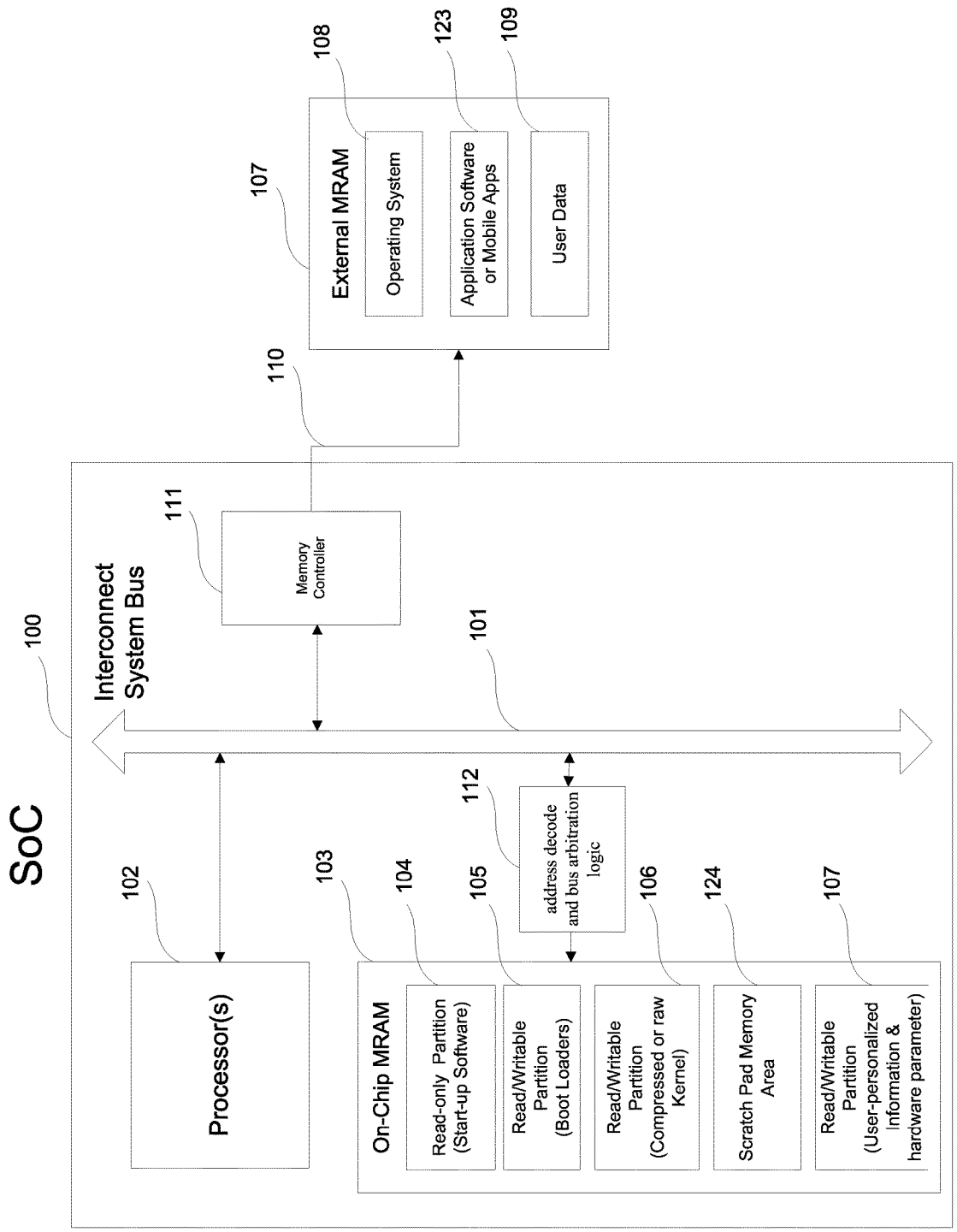

METHOD OF IMPLEMENTING MAGNETIC RANDOM ACCESS MEMORY (MRAM) FOR MOBILE SYSTEM-ON-CHIP BOOT

CROSS REFERENCE IO RELATED APPLICATIONS

The present application is a continuation of the commonly assigned application bearing Ser. No. 15/592,575 filed on May 11, 2017 and entitled "Method of Implementing Magnetic Random Access Memory (MRAM) for Mobile System-on-Chip Boot," which is a continuation of the commonly assigned application bearing Ser. No. 14/091,318 filed on Nov. 26, 2013 and entitled "Method of Implementing Magnetic Random Access Memory (MRAM) for Mobile System-on-Chip Boot," which claims priority to U.S. Provisional Patent Application No. 61/800,843, filed on Mar. 15, 2013, by Ngon Van Le, and entitled "Method of Implementing Magnetic Random Access Memory (MRAM) for System Boot".

BACKGROUND OF THE INVENTION

Field of the Invention

The invention relates to computer memory systems and particularly to System-on-Chip (SoC) memory systems using persistent memory that includes magnetic random access memory (MRAM).

Description of the Prior Art

Portable battery-back computing systems include but not limited to mobile phones, tablets, netbooks rely on the software stored in a read-only memory (ROM) coupled with other non-volatile memory and volatile memory devices to initialize the system boot process during power-on or reset.

The boot software including the bootROM, the boot loaders and the kernel is used to initialize and detect system hardware components such as processors, memory controllers, external random access memory (RAM) devices, mass storage devices, wireless modem, and other peripheral devices (keyboard, mouse etc . . . ) during the power-on or reset process. The boot software may be stored in multi-non-volatile memory devices or a single non-volatile memory device such as but not limited to raw NAND Flash or ECC-integrated-NAND Flash, discrete component or NAND Flash based storage devices such as embedded multi-media card (eMMC) or secure digital (SD) card or universal serial bus (USB) drive. Each of the non-volatile memory devices can be either external or integrated into the system on chip (SoC), and are connected to the SoC via a eMMC or SD or USB interface or other types of internal system buses.

An example of the mobile SoC boot execution stages are as follows:
1. When a user pushes a mobile's or a tablet's power button or resets the device, the SoC starts executing the hard-wired, start-up software code in ROM. The start-up software code is typically called bootROM.
2. The bootROM software will then initialize and detect the external boot sources and decide from where it loads a series of the boot-loaders. These boot-loaders contain multi-stage executable software codes, and are designed to initialize and detect the SoC's hardware components such as baseband processor, I/O peripherals, memory controllers, audio and video components. These boot-loaders may reside in multiple external memory boot sources or a single memory boot source, depending on the default hardware configuration of the SoC's internal fuses or pin-strapping.
3. In order to execute the boot-loaders, the bootROM must first copy the boot-loaders to the SoC's external RAM such as but not limited to low power double data rate 2 (LPDDR2) or low power double data rate 3 (LPDDR3) device, and then execute the boot loaders from the external RAM.
4. Once the boot-loaders finish the hardware initialization, the boot-loaders will look for the kernel which typically resides in either a separate external or internal boot source or the same boot source that the boot loaders reside. The kernel is responsible for managing the SoC system's resources, serving as the bridge between the hardware and the OS, and can be either in the compressed format or raw format. The boot-loaders load the kernel into the SoC's external RAM memory, de-compress it and save the de-compressed kernel in the SoC's external RAM memory if required, and execute the kernel from the SoC's external RAM.
5. The SoC boot process is now complete.

As the SoC boot process above describes, the boot loaders and the kernel software first have to be copied from external boot sources as described above to the SoC's external RAM and executed from the SoC's external RAM. The boot loaders and the kernel software cannot be executed from the external NAND Flash-based boot source(s) because the NAND Flash is a page oriented memory device and does not support execute-in-place (XIP) function.

These extra steps of reading the boot loaders and the kernel software from external boot sources, copying the software to the SoC's external RAM and then executing from the external RAM can slow down the boot process, resulting in reducing the battery life.

What is needed is an improved SoC system.

SUMMARY OF THE INVENTION

Briefly, a method of booting a system on chip (SoC) includes using an on-chip MRAM located in the SoC, to store a boot software that includes a start-up software, boot loaders, and kernel and user-personalized information in an on-chip magnetic random access memory (MRAM) located in and residing on the same semiconductor as the SoC. The method further includes directly executing the boot software from the on-chip MRAM by the SoC and directly accessing the user-personalized information from the MRAM by the SoC. Accordingly, a faster-performing SoC system is disclosed using low power persistent memory such as MRAM to store the boot software and operating system (OS) software and execute the OS software directly for the MRAM device(s).

By utilizing a system bus located in the SoC as opposed to an external memory interface for the boot process, the SoC boot up time can be significantly faster, the system is quickly accessed. Also, input/output (IO) power is significantly higher than core power in SoC. By reducing the number of IO transfers to and from the external devices, power consumption during boot-up is significantly reduced and battery life is extended These and other objects and advantages of the invention will no doubt become apparent to those skilled in the art after having read the following detailed description of the various embodiments illustrated in the several figures of the drawing.

IN THE DRAWINGS

FIG. 1 shows an on-chip MRAM device that is part of the SoC in accordance with the embodiment of the invention.

FIG. 1 also shows an external MRAM device connected to the memory controller.

FIG. 2 shows a flow chart of the relevant steps performed in booting the system using MRAM, in accordance with a method of the invention indicated in FIG. 1.

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Referring to FIG. 1, a system on chip (SoC) 100 is shown to include one or more processors 102 with embedded non-persistent memory (not shown). The SoC 100 is shown to include a processor 102, an on-chip MRAM 103, an address decode and bus arbitration logic 112, a system bus 101, and a memory controller 111. The processor 102 serves as the brain of the SoC system and communicates with the on-chip MRAM 103 and the memory controller 111 and other external peripherals (not shown) or external memory or storage devices (not shown) accordingly. The memory controller 111 is used to manage communications with external MRAM device(s) via external interface component 110. The on-chip MRAM 103 is an integrated persistent memory device in the SoC that is used to store the boot software and configuration data for the SoC and the other external processor such as but not limited to baseband processor. The on-chip MRAM 103 further includes a plurality of partitions in which each partition is formed by a group of fixed or configurable memory address range. The read-only partition 104 may contain the factory-programmed start-up software. This is the first piece of software that is executed by the SoC during the power-up or reset sequence. The read/writable partition 105 may contain the boot loader software. The on-chip MRAM 103 is shown to include a read-only fixed address range partition 104, a read/writable partition 105, a read/writable partition 106, a scratch pad memory area 124, and a read/writable partition 107. The SoC 100 is shown coupled to an external MRAM 107, which is shown to include an operating system software 108, an application software or mobile application 123, and a user data area 109.

The bus connecting the processor(s) 102, the memory controller 111, and the on-chip MRAM 103 are well known in the art and are often referred to as the system bus or the interconnect system bus 101. One of the characteristics of the system bus 101 is that it is much wider in term of its bus width and is therefore much faster in data transfer rate as opposed to the external interface component 110. The MRAM 103 is connected to an address decode and bus arbitration logic 112, which is well known to the art. The function of an address decode and bus arbitration logic 112 is to generate chip select signal and data access from multiple hardware components using the system bus 101 and for enabling the MRAM 103 to drive the bus 101 at a given time.

The MRAM 103 comprises a plurality of fixed and configurable partitions of memory: a read-only partition 104 that contains a fixed address range, storing the start-up software code; a read/writable partition 105 that contains a configurable address range, storing the boot loaders; a read/writable partition 106 that contains a configurable address range, storing the compressed or raw kernel; a read/writable partition 107 that contains a configurable address range, storing user-personalized application parameters and hardware configuration parameters.

The SoC 100 further includes memory controller 111 which manages communications with external MRAM memory device(s) 107 via the memory interface 110 such as but not limited to DDR, LPDDR2/3, ONFI or MRAM. It is noted that the boot execution sequence and the plurality of the partitions as indicated in the FIG. 1 are not limited in the execution order and the number of partitions indicated in FIG. 1.

What is needed is a SoC system using a combination of an on-chip MRAM device 103 and external MRAM device(s) 107 to provide a nearly instant-on experience for portable devices. The on-chip MRAM 103 comprises a plurality of fixed and configurable partitions of memory, i.e. 104-107, that can be used to store boot software and allow the boot software to be executed directly from a single on-chip MRAM, i.e. MRAM 103. In addition, the on-chip MRAM 103 can be used to store user-personalized application parameters such as but not limited to wireless calibration data such Transmitter Gain and Receiver Gain tables, audio and video settings, screen saver, camera settings, color lookup, font tables, and allow these parameters to be retrieved substantially instantly without consuming much power.

During power on or reset, the user-personalized and hardware configuration information can be accessed directly from the on-chip MRAM 103, eliminating data transfer from external boot sources to the SoC's external RAM (in this case external RAM not shown) or to the internal hardware components such as wireless modem processor, audio codec, display buffer, resulting in saving batter power and speed up the boot up time.

The external MRAM 107 allows the operating system (OS) software 108, application software or mobile apps 123 and user data 109 to be accessed directly from the external MRAM 107 without the need to load them into the SoC's external RAM (not shown).

The combination of using an on-chip MRAM and external MRAM to boot to the operation system can reduce external RAM, storage footprint (size of memory) and power consumption, and improve both performance and reliability of the SoC 100's system boot.

In an embodiment of the invention, the on-chip MRAM is located in and resides on the same semiconductor as the SoC 100.

FIG. 2 shows a flow chart of the steps performed by the SoC 100 for booting. Referring to FIG. 2, step 200, the SoC 100 begins to directly execute the start-up software 104 from the on-chip MRAM 103 during power-on or reset of the SoC. Next at step 201, the start-up software 104 initializes and detects the external boot source(s) and decides from where it loads the boot loaders 105. Any parameters that are required for this execution are stored in the partition 107.

Next at step 202, the start-up software 104 locates the boot loaders 105, loads it and executes it directly from the on-chip MRAM 103. Any parameters required for this execution are stored in the partition 107. At step 203, the boot loaders 105 perform a number of tasks, including but not limited to initializing the hardware components of the SoC 100 and looking for the kernel 106. Any parameters required for this execution are stored in the partition 107. At step 204, the boot loaders 105 execute the kernel 106. If the kernel 106 is in a compressed format, then the boot loaders 105 first decompresses the kernel 106, saves the decompressed kernel 106 to the scratch-pad memory area 124 and then executes the kernel 106 from the scratch-pad memory area 124. At step 205, the kernel 106 launches the operation system 108 and application software or mobile apps 123 (if required) directly from the external MRAM 107. Any parameters required for this execution are stored in the partition 107. The boot process ends at step 206.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method for booting a system-on-chip (SoC) comprising:

directly executing a boot software from an on-chip magnetic random access memory (MRAM) residing on a same semiconductor as the SoC;

directly executing an operating system software from an external MRAM by the SoC without loading the operating system software into a volatile memory;

directly executing an application software from the external MRAM by the SoC, wherein the external MRAM is coupled to the SoC and is configured for storing the operating system software and the application software.

2. The method for booting a system-on-chip (SoC), as recited in claim 1, wherein required parameters for executing the boot software, the operating system software, and the application software are accessed directly from the on-chip MRAM.

3. The method for booting a system-on-chip (SoC), as recited in claim 1, wherein the on-chip MRAM includes one or more partitions with the boot software, a user-personalized information, and a scratch-pad memory space occupying separate partitions.

4. The method for booting a system-on-chip (SoC), as recited in claim 3, wherein the SoC includes a compressed kernel software and the method further includes the steps of decompressing the compressed kernel software to the scratch-pad memory space and executing the decompressed kernel software directly from the scratch-pad memory space.

5. The method for booting a system-on-chip (SoC), as recited in claim 1, wherein the on-chip MRAM comprises a plurality of fixed and configurable partitions of memory.

* * * * *